United States Patent [19]

Arami et al.

[11] Patent Number: 5,250,137
[45] Date of Patent: Oct. 5, 1993

[54] PLASMA TREATING APPARATUS

[75] Inventors: Junichi Arami, Hachioji; Toshihisa Nozawa, Yokohama; Keiji Horioka, Kawasaki; Katsuya Okumura, Yokohama, all of Japan

[73] Assignees: Tokyo Electron Limited, Tokyo; Kabushiki Kaisha Toshiba, Kawasaki, both of Japan

[21] Appl. No.: 731,475

[22] Filed: Jul. 17, 1991

[30] Foreign Application Priority Data

Jul. 20, 1990 [JP] Japan ................... 2-192465

[51] Int. Cl.⁵ .................................. B05C 5/00
[52] U.S. Cl. ......................... 156/345; 156/643; 118/723; 118/724; 118/728
[58] Field of Search ............. 156/345, 643, 646; 118/723, 724, 728; 204/298.16, 298.19, 298.2, 298.15, 298.09, 298.34, 298.37

[56] References Cited

U.S. PATENT DOCUMENTS

| 4,384,918 | 5/1983 | Abe | 156/643 |
| 4,399,016 | 8/1983 | Tsukada et al. | 156/345 X |
| 4,771,730 | 9/1988 | Tezuka | 156/345 X |
| 4,798,650 | 1/1989 | Nakamura et al. | 156/643 |
| 4,878,995 | 11/1989 | Arikado et al. | 156/643 |
| 4,897,171 | 1/1990 | Ohmi | 156/345 X |

FOREIGN PATENT DOCUMENTS

| 439000 | 7/1991 | European Pat. Off. | 156/345 |
| 227021 | 9/1988 | Japan | 156/345 |
| 200625 | 8/1989 | Japan | 156/345 |

Primary Examiner—Thi Dang
Attorney, Agent, or Firm—Oblon, Spivak, McClelland, Maier & Neustadt

[57] ABSTRACT

A plasma treating apparatus includes an electrostatic chuck constructing an electrically conductive layer and insulating layers having the conductive layer sandwiched therebetween. A RF current supplied to a susceptor is prevented from flowing into the conductive layer of the chuck so as to suppress the RF current leakage from a cable connected to the conductive layer of the chuck for high voltage application. The plasma treating apparatus includes a chamber having a first electrode, a second electrode disposed within the chamber, a cylindrical high frequency power supply member inserted from the outside into the chamber such that the tip of the member is connected to the second electrode, high frequency power supply means for supplying a high frequency power through the power supply member to the second electrode so as to generate a plasma in the region between the first and second electrodes within the chamber, an electrostatic chuck arranged on the second electrode and constructed such that a conductive layer is formed within an insulating layer, a cable for applying a high voltage, the cable being inserted into the power supply member and having the tip connected to the conductive layer of the electrostatic chuck, and a power source connected to the cable.

12 Claims, 2 Drawing Sheets

PLASMA TREATING APPARATUS

BACKGROUND OF THE INVENTION

1. Field of the Invention

The present invention relates to a plasma treating apparatus, particularly, to a plasma treating apparatus with an improved supply mechanism of a high frequency power.

2. Description of the Related Art

A plasma treating apparatus, e.g., a plasma etching apparatus, comprises a chamber maintained at a vacuum and kept at the ground potential, a susceptor arranged within the chamber and supplied with a high frequency power, the susceptor being electrically insulated from the chamber, an electrostatic chuck arranged on the susceptor for fixing a workpiece, e.g., a semiconductor wafer, within the chamber, an exhaust means for discharging a gas from within the chamber, and a supply means for supplying a reacting gas for the etching into the chamber.

Proposed is an electrostatic chuck of monopole type constructed such that an electrically conductive layer is formed within an insulating layer. The electrostatic chuck of this construction permits fixing a workpiece (wafer) as follows. Specifically, if a high frequency power is supplied to the susceptor, plasma is generated between the susceptor and the chamber of the ground potential, which faces the susceptor, with the result that the ions contained in the plasma permit the wafer disposed on the electrostatic chuck to bear the ground potential. If a high voltage is applied under this condition to the conductive layer included in the electrostatic chuck, Coulomb attraction is generated between the conductive layer of the chuck and the wafer kept at the ground potential, i.e., the wafer disposed on the insulating layer of the chuck. As a result, the wafer is electrostatically sucked so as to be fixed to the insulating layer of the electrostatic chuck. It follows that the plasma etching apparatus of the construction described above necessitates a cable for applying a high voltage to the conductive layer of the electrostatic chuck and a means for supplying a high frequency power to the susceptor.

Where the electrostatic chuck is arranged on the susceptor, the conductive layer of the chuck is positioned to face the susceptor with the insulating layer of the chuck interposed therebetween, with the result that a capacitor of a large area is formed between the susceptor and the conductive layer of the electrostatic chuck. What should be noted is that, if a high frequency power is supplied to the susceptor, the capacitor noted above forms a path of the high frequency power. In other words, the high frequency power (RF current) supplied to the susceptor flows into the conductive layer of the electrostatic chuck through the capacitor. The RF current further flows from the conductive layer into the cable connected thereto, giving rise to the problem that the cable acts as an antenna for scattering the RF current. To be more specific, the cable is coupled with a member of the ground potential, e.g., chamber, positioned in the vicinity of the cable so as to form a capacitor and, thus, to bring about RF current leakage.

What should also be noted is that the RF current flowing into the conductive layer of the electrostatic chuck breaks down the insulating film positioned between the conductive layer and the susceptor, leading to a short-circuiting between the conductive layer and the susceptor.

To reiterate, the problems noted above are brought about in the case of using an electrostatic chuck of a monopole type construction. In addition, similar problems are brought about in the case of using an electrostatic chuck of other constructions including, for example, an electrostatic chuck of a dipole type in which two conductive layers, which are electrically insulated from each other, are arranged with an insulating layer interposed therebetween, positive and negative voltages being applied to these two conductive layers, respectively, and an electrostatic chuck of a tetrapole type in which four conductive layers, which are electrically insulated from each other, are arranged with an insulating layer interposed between adjacent conductive layers, positive voltage being applied to two of the four conductive layers and negative voltage being applied to the other two conductive layers.

SUMMARY OF THE INVENTION

An object of the present invention is to provide a plasma treating apparatus capable of preventing an RF current supplied to a susceptor such as a second electrode from flowing into a conductive layer included in an electrostatic chuck so as to suppress the RF current leakage into a cable connected to the conductive layer for applying a high voltage to the conductive layer. Since flow of the RF current into the conductive layer included in the chuck is suppressed, the apparatus of the prevent invention makes it possible to present the insulation breakdown of the insulating layer included in the electrostatic chuck.

According to the present invention, there is provided a plasma treating apparatus, comprising:

a chamber having a first electrode;

a second electrode disposed within the chamber;

a cylindrical high frequency power supply member inserted from the outside into the chamber such that the tip on the member is connected to the second electrode;

high frequency power supply means for supplying a high frequency power through the power supply member to the second electrode so as to generate a plasma in the region between the first and second electrodes within the chamber;

an electrostatic chuck arranged on the second electrode and constructed such that a conductive layer is formed within an insulating layer;

a cable for applying a high voltage, the cable being inserted into the power supply member and having the tip connected to the conductive layer of the electrostatic chuck; and a power source connected to the cable.

The chamber also acts as a first electrode showing the ground potential.

In the present invention, it is possible to use an electrostatic chuck of a monopole type constructed such that a single conductive layer is formed within the insulating layer. It is also possible to use an electrostatic chuck of a dipole type in which two conductive layers, which are electrically insulated from each other, are arranged with an insulating layer interposed therebetween, positive and negative voltages being applied to these two conductive layers, respectively, and an electrostatic chuck of a tetrapole type in which four conductive layers, which are electrically insulated from each other, are arranged with an insulating layer interposed between adjacent conductive layers, a positive voltage being applied to two of the four conductive layers and a negative voltage being applied to the other two conductive layers.

In the present invention, a coil having a large reductance relative to the RF power supplied from the high frequency power source and a large electrical resistance may be connected to that portion of the cable which protrudes outside from the cylindrical high frequency power supply member. It is also possible to connect a low-pass filter consisting of said coil and a capacitor to the protruding portion of the cable, i.e., a capacitor arranged in parallel with the DC power source and having one end connected to the coil and the other end connected to the ground.

In the apparatus of the particular construction, a high frequency power is supplied to a susceptor such as the second electrode arranged within the chamber of the ground potential so as to generate a plasma between the susceptor and the chamber acting as a first electrode. In generating the plasma, the particular construction of the present invention permit suppressing the leakage of the RF current flowing from the susceptor into the conductive layer of the electrostatic chuck disposed on the susceptor through the cable connected to the conductive layer. What should also be noted is that, since the RF current leakage is suppressed as pointed above, it is also possible to suppress the flow of the RF current from the susceptor into the conductive layer of the electrostatic chuck. It follows that it is possible to prevent the insulation breakdown of the insulating layer interposed between the susceptor and the conductive layer of the chuck.

To be more specific, a capacitor of a large area is formed between the susceptor and the conductive layer of the electrostatic chuck. If a high frequency power is supplied to the susceptor, the capacitor thus formed provides a path of the high frequency power, with the result that the high frequency power (RF current) supplied to the susceptor flows into the conductive layer of the electrostatic chuck and, then, into the cable connected to the conductive layer. In this case, if a member bearing the ground potential, e.g., the chamber, is positioned in the vicinity of the cable, the cable is coupled with the chamber so as to perform the function of a capacitor and, thus, to bring about leakage of the RF current.

In the plasma treating apparatus of the present invention, a cylindrical high frequency power supply member having the tip connected to the susceptor is inserted into the chamber. Also, the cable for applying a high voltage to the conductive layer of the electrostatic chuck is inserted the high frequency power supply member so as to be connected to the conductive layer. What should be noted is that the cable is shielded by the cylindrical high frequency power supply member having the same potential as the RF current which flows into the cable in the step of supplying the high frequency power to the susceptor. In other words, a member of the ground potential is not positioned in the vicinity of the cable, making it possible to suppress effectively the RF current leakage from the cable. Since the RF current leakage is suppressed, it is possible to suppress the flow of the RF current from the susceptor into the conductive layer of the electrostatic chuck, with the result that the insulation breakdown can be prevented in the insulating layer positioned between the susceptor and the conductive layer noted above.

It should also be noted that, as described previously, it is possible to connect a coil having a large reductance relative to the high frequency power supplied to the susceptor and a high electrical resistance to that portion of the cable which protrudes outside from the cylindrical high frequency power supply member. In this case, the electrical resistance of the cable relative to the RF current is substantially increased so as to further suppress the flow of the RF current into the cable.

Further, a low-pass filter consisting of the coil noted above and a capacitor having one end connected to the coil and the other end to the ground potential point may also be connected to the protruding portion of the cable. In this case, the very small RF current flowing into the coil can be released into the ground through the capacitor with the result that it is possible to prevent effectively the RF current from flowing into the DC power source connected to the cable.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

Figure 1:
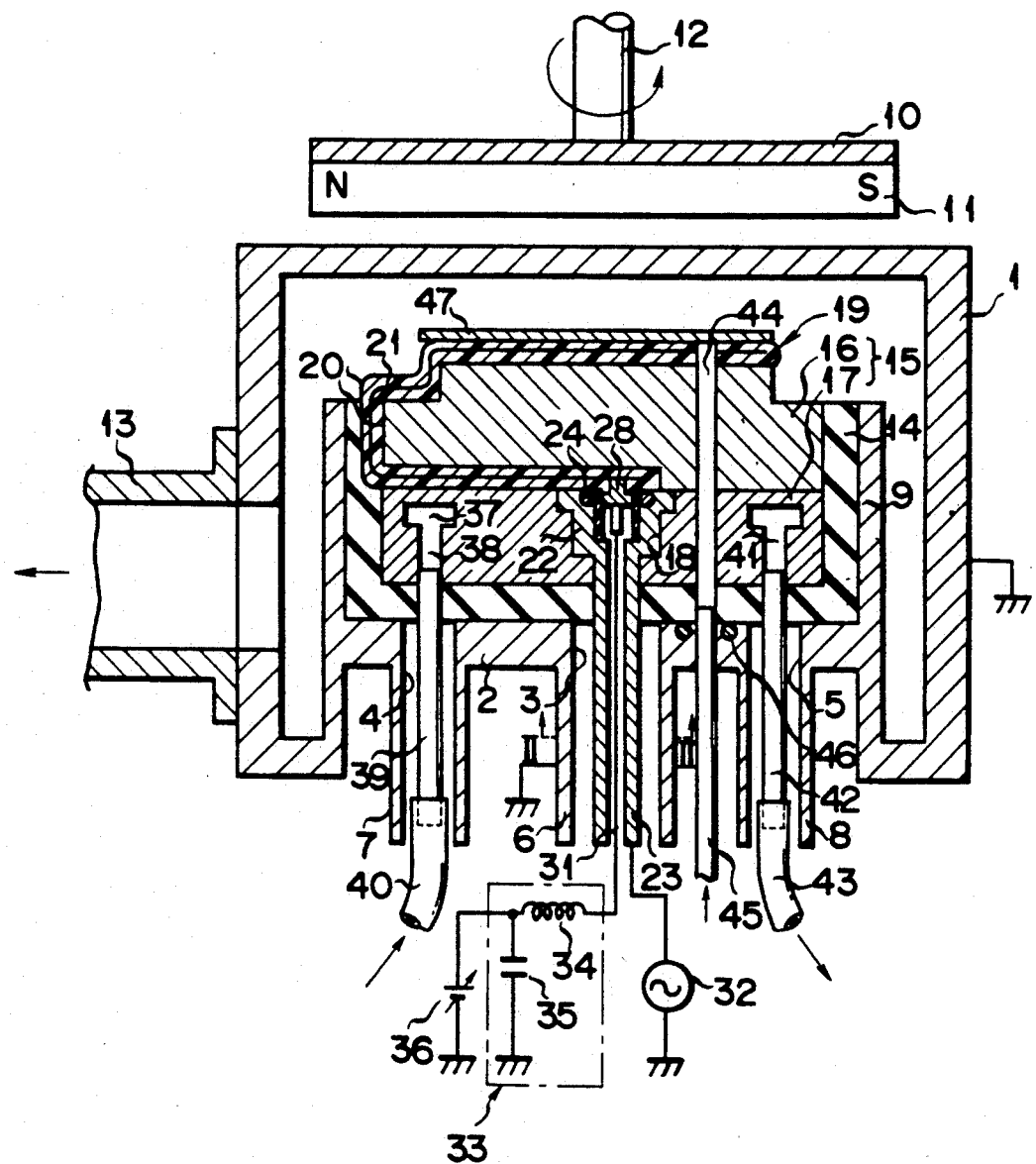
FIG. 1 is a cross sectional view showing a magnetron plasma etching apparatus according to one embodiment of the present invention.
Figure 2:
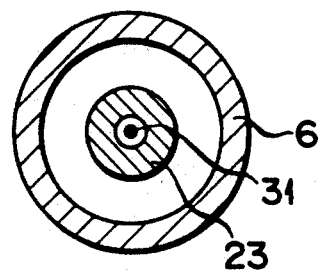
FIG. 2 is a cross sectional view along the line II—II shown in FIG. 1, the drawing being magnified in FIG. 2.
Figure 3:
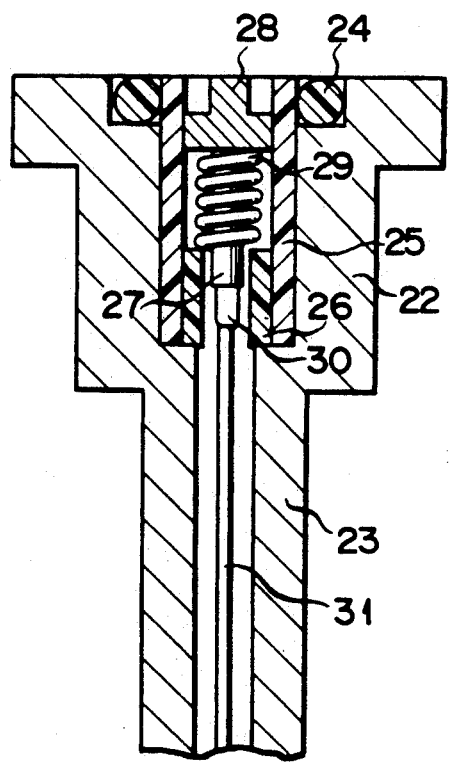
FIG. 3 is a cross sectional view showing the gist portion of the apparatus shown in FIG. 1 in a magnified fashion.

FIGS. 1 to 3 collectively show a magnetron plasma etching apparatus according to on embodiment of the present invention. As shown in FIG. 1, the apparatus comprises a cylindrical chamber 1 made of conductive material which is connected to the ground. The chamber 1 also acts as a first electrode. The most part of a bottom portion 2 of the chamber 1 projects inward (or upward) in a cylindrical form. The chamber 1 is formed of, for example, copper plated with silver. Three holes 3, 4 and 5 are formed in the central portion of the bottom portion 2 inwardly projecting in a cylindrical form and away from the central portion. As shown in the drawing, cylindrical bodies 6, 7 and 8, which project downward, are integrally mounted to the peripheries of the holes 3, 4 and 5, respectively, formed in the bottom portion 2. Also, a cylindrical body 9 for housing a susceptor is integrally formed at the bottom portion 2 projecting inward in a cylindrical form. Further, a magnetic field generation means, e.g., a plate-like permanent magnet 11 held by a holder 10, is arranged above the chamber 1. A rotary shaft 12 for rotating the permanent magnet 11 is fixed to the upper region of the holder 10 in the central portion. On the other hand, an exhaust pipe 13 is connected at one end to a lower portion of the side wall of the chamber 1. An exhaust system (not shown) is connected to the other end of the exhaust pipe 13. Further, a gas supply pipe (not shown) for supplying a predetermined etching gas is connected to an upper portion of the side wall of the chamber 1. Still further, a load lock gate (not shown) for putting a workpiece in and out of the chamber 1 is formed in an upper portion of the side wall of the chamber 1.

A cylindrical insulating member 14 having a bottom is housed in the cylindrical body 9. The cylindrical insulating member 14 is formed of, for example, a ceramic material. Alternatively, a fluorine resin may be used for forming the cylindrical insulating member 14. A susceptor 15 such as a second electrode made of, for example, aluminum is housed in the cylindrical insulating member 14. As seen from the drawing, the susceptor 15 consists of an upper susceptor member 16 and a lower susceptor member 17. The upper susceptor member 16 is removably mounted to the lower susceptor member 17. The upper susceptor member 16 projects upward from the upper end of the insulating member 14. A hole 18 through which a rod for supplying an electric power is inserted into the chamber 1 is formed to extend from the upper surface of the lower susceptor member 16 to reach the insulating member 14. That portion of the hole 18 which is positioned within the lower susceptor member 16 is formed stepwise such that the diameter of the hole is enlarged toward the upper region. An electrostatic chuck 19 is disposed on the upper susceptor member 16. One end portion of the electrostatic chuck 19 extends through the region between the side wall of the upper susceptor member 16 and the insulating member 14 and through the region between the upper and lower susceptor members 16 and 17 so as to reach the upper portion of the hole 18. The electrostatic chuck 19 is of a monopole structure, which is constructed such that a conductive layer 21 made of, for example, copper is interposed between two insulating films 20 made of, for example, polyimide. In that portion of the electrostatic chuck 19 which is positioned above the hole 18, the lower insulating film 20 is removed so as to expose the conductive layer 21.

As shown in FIG. 2, a cylindrical high frequency power supply member 23 having a cylindrical power supply portion 22 mounted on the upper end is coaxially inserted into the cylindrical body 6, with the result that the power supply member 23 is connected to the lower susceptor member 17 via the power supply portion 22. As shown in FIGS. 1 and 3, an O-ring 24 is embedded in the upper surface region of the cylindrical power supply portion 22 so as to ensure a sufficient sealing in the region between the electrostatic chuck 19 and the power supply portion 21. An insulating cylindrical body 25 made of, for example, a fluorine resin is inserted into the cylindrical power supply portion 22. A cylindrical stopper member 26 made of, for example, a fluorine resin is inserted into a lower portion of the insulating cylindrical body 25. A power supply head 28 having a terminal rod 27 at the lower portion is arranged within the insulating cylindrical body 25. The terminal rod 27 noted above extends to reach the cylindrical stopper member 26. A coil spring 29 is provided within the insulating cylindrical body 25 positioned between the power supply head 28 and the cylindrical stopper member 26 in a manner to surround the terminal rod 27. The coil spring 29 noted above serves to push upward the power supply head 28 so as to permit the power supply head 28 to be connected to the exposed conductive layer 21 of the electrostatic chuck 19. A lead wire 30 is connected at one end to the lower end of the terminal rod 27, with the other end of the lead wire 30 being connected to the upper end of the cable 31 for supplying a high voltage to the conductive layer 21 of the electrostatic chuck 19. As shown in FIG. 2, the other end portion of the cable 31 coaxially extends within the cylindrical high frequency power supply member 23 so as to reach the outside. Because of the particular construction of connection, the cable 31 is electrically connected to the conductive layer 21 of the electrostatic chuck 19 through the lead wire 30, the terminal rod 27 and the power supply head 28. Also, the cable 31 is electrically insulated from the cylindrical high frequency power supply member 23.

A high frequency power source 32 generating a power of, for example, 13.56 MHz is connected to the lower end of the cylindrical high frequency power supply member 23. Also, a low-pass filter 33 is connected to the cable 31. The low-pass filter 33 consists of a coil 34 having a large reductance relative to the high frequency power supplied from the power source 32 and also having a high electrical resistance and a capacitor 35 having one end connected in series to the coil 32 and the other end connected to the ground. A DC power source 36 is connected to the coil 34 in parallel with the capacitor 35.

An annular hole 37 for circulating a cooling liquid is formed in the lower susceptor member 17. On the other hand, a cooling liquid supply hole 38 is formed in portions of the lower susceptor member 17 and the insulating member 14 in a manner to extend from the cooling liquid circulating hole 37 to reach the hole 4 formed in the chamber 1. It should be noted that the hole 38 is internally threaded in the portion which is positioned within the lower susceptor member 17. A cooling liquid supply pipe 39 made of a metal, e.g., copper, coaxially extends within the cylindrical body 7 so as to be inserted into the supply hole 38 such that the inserted portion of the pipe 39 is engaged with the threaded portion of the supply hole 38. A pipe 40 made of a material having resistance to chemicals and suppressing dust generation, for example, a fluorine resin is connected to the lower end of the cooling liquid supply pipe 39 positioned within the cylindrical body 7. A cooling liquid discharge hole 41 is formed within the lower susceptor member 17 and the insulating member 14 in a manner to extend from that portion of the circulating hole 37 which is positioned on the opposite side of the supply hole 38 with respect to the lower susceptor member 17 to the hole 5 of the chamber 1. It should be noted that the discharge hole 41 is internally threaded in the portion positioned within the lower susceptor member 17. A cooling liquid discharge pipe 42 made of a metal, e.g., copper, coaxially extends within the cylindrical body 8 so as to be inserted into the discharge hole 41 such that the inserted portion of the pipe 42 is engaged with the threaded portion of the discharge hole 41. Further, a pipe 43 made of a material having resistance to chemicals and suppressing dust generation, for example, a fluorine resin is connected to the lower end of the discharge pipe 42 positioned within the cylindrical body 8.

A gas inlet hole 44 is formed to extend from the bottom portion 2 of the chamber 1 through the insulating member 14, the lower susceptor member 17, and the upper susceptor member 16 so as to reach the electrostatic chuck 19. A theading treatment is applied to the most portion of the gas inlet hole 44 positioned at the bottom portion 2. A gas inlet pipe 45 made of, for example, copper is inserted into that portion of the gas inlet hole 44 which is positioned within the bottom portion 2 and the insulating member 14 so as to be with the threaded portion of the gas inlet hole 44. Further, an 0-ring 46 is interposed between the insulating member 14 and the bottom portion 2 of the chamber 1 through which extends the gas inlet hole 44.

The magnetron plasma etching apparatus of the construction described above is operated as follows. In the first step, a workpiece 47, e.g., a semiconductor wafer, is transferred through the gate (not shown) into the chamber 1 so as to be put on the electrostatic chuck 19. Under this condition, an exhaust system (not shown) is operated so as to release the gas within the chamber 1 to the outside through the discharge pipe 13. As a result, a predetermined degree of vacuum is established within the chamber 1. Then, a desired reacting gas is supplied through a gas supply pipe (not shown) into the chamber 1. At the same time, a cooling water is supplied through the pipe 40, the cooling liquid supply pipe 39 and the cooling liquid supply hole 38 to the annular hole 37 for circulating a cooling liquid so as to cool the lower susceptor member 17 and the upper susceptor member 16. After the cooling, the cooling liquid is discharged to the outside through the cooling liquid discharge hole 41, the cooling liquid discharge pipe 42 and the pipe 43.

A high frequency power having a frequency of, for example, 13.56 MHz is supplied from the high frequency power source 32 to the lower susceptor member 17 of the susceptor 15 through the cylindrical power supply member 22 so a to generate a plasma of the reacting gas within that region of the chamber 1 which is positioned between the upper susceptor member 16 and the chamber 1 which is kept at the ground potential. Under this condition, the DC power source 36 is turned on so as to apply a high voltage of, for example, 1 to 2 kV to the conductive layer 21 of the electrostatic chuck 19 via the low path filter 33, the cable 31, the terminal rod 27 and the power supply head 28. As a result, the wafer 47 is electrically connected to the chamber 1 which is kept at the ground potential via the ions and electrons contained in the plasma. It follows that the wafer 47 is electrostatically fixed to the electrostatic chuck 19 by the Coulomb attraction generated between the wafer 47 and the conductive layer 21 of the electrostatic chuck 19 disposed to face the wafer 47 with the insulating layer 20 interposed therebetween. Under this condition, the DC power source 36 is turned off, and a gas such as a helium gas is introduced into a region between the electrostatic chuck 19 and the wafer 47 through the gas inlet pipe 45 and the gas inlet hole 44 so as to suppress the temperature elevation of the wafer 47 exposed to the plasma. At the same time, the permanent magnet 11 is rotated at a predetermined speed by driving the rotary shaft 12. The rotation of the permanent magnet 11 causes the horizontal magnetic field formed in the vicinity of the wafer 47 to be rotated, with the result that a uniform plasma treatment is applied to the entire surface region of the wafer 47. Also, the electric field crosses the horizontal magnetic field at right angles as to bring about a magnetron discharge. As a result, the probability of the ion bombardment within the plasma is increased. It follows that it is possible to generate plasma even if the degree of vacuum is increased within the chamber 11. To be more specific, even if the amount of the reactive gas within the chamber is diminished in an attempt to diminish the amount of the radical ions which are involved in the under-etching, sufficient amounts of only the ions of the reactive gas and electrons are generated, with the result that a highly anisotropic plasma etching is applied to the wafer 47.

In the plasma etching described above, it is possible to effectively suppress the flow of the RF current supplied to the susceptor 15 into the conductive layer 21 of the electrostatic chuck 19. Specifically, if the electrostatic chuck 19 is disposed on the upper susceptor member 16 of the susceptor 15, the conductive layer 21 of the chuck 19 is positioned to face the upper susceptor member 16 with the insulating layer 20 of the chuck 19 interposed therebetween. It follows that a capacitor of a large area is formed by the conductive layer 21 and the upper susceptor member 17. Naturally, if a high frequency power is supplied to the upper susceptor member 17, the capacitor provides a passageway of the high frequency power, with the result that the high frequency current (RF current) supplied to the upper susceptor 17 flows into the cable 31 for the high voltage application through the capacitor noted above, the conductive layer 21, the power supply head 28, the terminal rod 27 and the lead wire 30.

It should be noted that the cable 31 for applying a high voltage is coaxially inserted into the cylindrical high frequency power supply body 23, as shown in FIGS. 1 and 2. As a result, the region around the cable 31 is shielded by the power supply body 23 which is equal in phase and potential to the RF power. In other words, a member differing in potential from the RF power, e.g., the chamber 1 kept at the ground potential, is not present in the vicinity of the cable 31, making it possible to effectively suppress the leakage of the RF current which is caused by the electrical coupling of the cable 31 with a member having the ground potential. To reiterate, the cable 31 for the high voltage application is coaxially inserted into the cylindrical high frequency power supply body 23 in the present invention, with the result that the power supply body 23 also acts as a shielding member of the RF current. It follows that the particular construction of the present invention makes it possible to markedly improve the difficulty inherent in the prior art, i.e., the difficulty that the cable 31 acts as an antenna so as to scatter the RF power into the surrounding region. What should also be noted is that, since the present invention permit suppressing the RF current leakage through the cable 31, it is possible to suppress the flow of the RF current from the upper susceptor member 16 into the conductive layer 21 of the electrostatic chuck 19.

It should also be noted that the coil 34 having a large reductance relative to the RF power of 13.56 MHz, which is supplied to the upper susceptor member 16, and a high electrical resistance is connected in series to that portion of the cable 31 which extends outward from the cylindrical high frequency power supply body 23, with the result that the cable 31 substantially has a higher electrical resistance to the RF power. It follows that the flow of the RF current into the cable 31 can be markedly lowered, i.e., lowered to 1/100 to 1/1000 compared with the case where the coil 34 is not connected to the cable 31.

As described above, the cylindrical high frequency power supply body 23 is allowed to act as a shielding member of the RF power. In addition, the coil 34 connected to the cable 31 permits markedly lowering the flow of the RF current into the cable 31. As a result, it is possible to markedly suppress the flow of the RF current into the conductive layer 21 of the electrostatic chuck 19. It follows that the insulation breakdown of the insulating layer 20 positioned between the upper susceptor 16 and the conductive layer 21 of the electrostatic chuck 19 can be effectively prevented.

What should also be noted is that the low-pass filter 33 consisting of the coil 34 and the capacitor 35 connected in series at one end to the coil 34 and to the ground at the other end is connected to the cable 31. As a result, a very small amount of the RF current flowing into the coil 34 can be released through the capacitor 35 into the ground, making it possible to prevent the RF current from flowing into the DC power source 36 connected to the cable 31.

The magnetron plasma etching apparatus constructed as shown in FIGS. 1 to 3 produces prominent effects, as summarized below:

1. The susceptor 15 is formed of the upper susceptor member 16 and the lower susceptor member 17. The upper susceptor member 16 is removably mounted to the lower susceptor member 17. It follow that, where the susceptor has been contaminated in the plasma etching treatment, it is possible to renew the upper susceptor member 16 alone. Naturally, the maintenance of the apparatus can be performed very easily.

2. The electrostatic chuck 19 is a monopole structure. Thus, the wafer 47 can be electrostatically fixed satisfactorily with a simple construction of the apparatus.

3. The cylindrical high frequency power supply member 23 is inserted into the cylindrical body 6 which is integrally mounted to the bottom portion 2 of the chamber 1 which is set at the ground potential. It follows that the power supply member 23 to which the RF power is supplied can be shielded by the cylindrical body 6 which is set at the ground potential, with the result that the RF current leakage from the power supply member 23 can be effectively prevented.

4. Each of the cooling liquid supply pipe 39 made of a metal and the cooling liquid discharge pipe 42 made of a metal is connected to the lower susceptor member 17 to which the RF power is supplied, with the result that the RF current tends to leak through these supply pipe 39 and discharge pipe 42. In order to overcome the difficulty, these pipes 39 and 42 are coaxially inserted into the cylindrical bodies 7 and 8, respectively, which are integrally mounted to the bottom portion 2 of the chamber 1 which is set at the ground potential. In other words, the cooling liquid supply pipe 39 and the discharge pipe 42, which are supplied with the RF power, are shielded by the cylindrical bodies 7 and 8 which are kept at the ground potential. Of course, the particular construction permits suppressing the RF current leakage through the supply pipe 39 and the discharge pipe 42. Further, the pipes 40 and 43 each formed of, for example, a fluorine resin are connected to the lower ends of the cooling liquid supply pipe and the discharge pipe positioned within the cylindrical bodies 7 and 8, respectively. It follows that it is possible to determine as desired the length of each of the cooling liquid supply system and the discharge system without worrying about the RF current leakage.

In the embodiment described above, the technical idea of the present invention is applied to a magnetron plasma etching apparatus. However, the technical idea of the present invention can also be applied similarly to other plasma treating apparatuses such as a plasma CVD apparatus or a sputtering apparatus.

In the embodiment described above, the technical idea of the present invention is applied to the treatment of a semiconductor wafer. However, it is of course possible to apply the technical idea of the present invention to the treatment of other workpieces such as a glass substrate for a liquid crystal display (LCD) device.

As described above, the present invention provides a plasma treating apparatus. In the present invention, it is possible to prevent the RF current supplied to the susceptor from flowing into the conductive layer included in the electrostatic chuck. Naturally, it is possible to suppress the RF current leakage from a cable connected to the conductive layer of the electrostatic chuck for applying a high voltage to the conductive layer. It is also possible to suppress the flow of the RF current into the conductive layer of the chuck, with the result that the insulation breakdown can be prevented in the insulating layer included in the electrostatic chuck. It follows that the plasma treating apparatus of the present invention permits a high treating efficiency with a high reliability.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

We claim:

1. A plasma treating apparatus comprising:
   a chamber having a first electrode;
   means for supplying a reactive gas into said chamber;
   a second electrode located within the chamber and comprising upper and lower electrodes;
   a cylindrical high frequency power supply member inserted in the chamber from outside, one tip end of the high frequency power supply member being located between the upper electrode and the lower electrode of the second electrode and being connected to the second electrode, and the interior of the high frequency power supply member being maintained at atmospheric-pressure;
   high frequency power supply means for supplying high frequency power to the second electrode via said power supply member to generate plasma in the region between the first and second electrodes;
   an electrostatic chuck for electrostatically holding a workpiece upon plasma generation, located on said upper electrode of the second electrode, having one end extending into the region between the upper electrode and the lower electrode, and constructed to include a conductive layer between a two-folded insulating layer;
   a cable for applying a high voltage, inserted in the power supply member and having a terminal connected to the conductive layer of the electrostatic chuck located between the upper electrode and the lower electrode; and
   pushing means for pushing the terminal toward the conductive layer of the electrostatic chuck.

2. The apparatus according to claim 1, wherein said chamber performs the function of the first electrode.

3. The apparatus according to claim 1, which further comprises means for generating a magnetic field in parallel with the upper surface of the workpiece.

4. The apparatus according to claim 1, wherein said electrostatic chuck is a monopole type structure constructed such that a single conductive layer is formed within an insulating layer.

5. The apparatus according to claim 1, further comprising means for supplying a cooling gas inserted from the outside into the chamber such that a tip of said means for supplying a cooling gas is positioned between said electrostatic chuck and said workpiece.

6. The apparatus according to claim 1, wherein a coil having a large reductance relative to the high frequency power supplied from said high frequency power source and a high electrical resistance is connected in series to that portion of said cable which extends outward from the power supply member.

7. The apparatus according to claim 6, wherein a low-pass filter is connected to said cable, and comprises said coil and a capacitor having one end connected to said coil in parallel with a DC power source and having the other end connected to the ground.

8. The apparatus according to claim 1, wherein said lower electrode is provided with cooling means.

9. The apparatus according to claim 8, wherein said cooling means comprises a cooling liquid circulating hole formed within said lower electrode, cylindrical members each mounted to the periphery of each of the holes formed at the bottom portion of the chamber such that each of said cylindrical members extends downward, a cooling liquid supply pipe coaxially inserted into one of said cylindrical members and having the tip portion communicating with said circulating hole, a cooling liquid discharge pipe concentrically inserted into the other cylindrical member and having the tip portion communicating with said circulating hole, and a pipe made of an insulating material and connected to those portions of the cooling liquid supply pipe and the cooling liquid discharge pipe which are positioned within the cylindrical members.

10. The apparatus according to claim 1, further comprising an O-ring interposed between an upper surface of the cylindrical high frequency power supply member and a lower surface of the upper electrode of the second electrode.

11. The apparatus according to claim 1, wherein a cylindrical insulating member is located on the inner surface of the upper portion of the cylindrical high frequency power supply member, and the pushing means is located within the cylindrical insulating member.

12. The apparatus according to claim 11, wherein the pushing member is a spring.

* * * * *